US012757421B2

(12) United States Patent
Zhou et al.

(10) Patent No.: US 12,757,421 B2
(45) Date of Patent: Oct. 6, 2026

(54) HIGH NOISE IMMUNITY TRIAC STRUCTURE

(71) Applicant: Littelfuse Semiconductor (Wuxi) Co., Ltd., Wuxi (CN)

(72) Inventors: Jifeng Zhou, Wuxi (CN); Glenda Zhang, Wuxi (CN); Lei He, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 390 days.

(21) Appl. No.: 18/526,565

(22) Filed: Dec. 1, 2023

(65) Prior Publication Data

US 2024/0222481 A1 Jul. 4, 2024

(30) Foreign Application Priority Data

Dec. 30, 2022 (CN) ........................ 202211722830.6

(51) Int. Cl.
*H10D 18/80* (2025.01)
*H10D 18/01* (2025.01)

(52) U.S. Cl.
CPC ........... *H10D 18/80* (2025.01); *H10D 18/021* (2025.01)

(58) Field of Classification Search
CPC .... H10D 18/80; H10D 18/021; H10D 62/104; H10D 62/127; H10D 62/141; H10D 64/291; H10D 62/105; H10D 62/124; H10D 18/60; H10D 62/142; H10D 62/148
See application file for complete search history.

(56) References Cited

U.S. PATENT DOCUMENTS 3,964,091 A 6/1976 Berndes
4,021,837 A 5/1977 Hutson
4,130,828 A 12/1978 Locqueneux
4,812,893 A * 3/1989 Bacuvier ................ H10D 18/80 257/163
RE33,209 E * 5/1990 Plummer ............ H10D 84/151 257/335
2012/0161200 A1* 6/2012 Hague .................... H10D 8/041 257/E29.337
2020/0411674 A1 12/2020 Vobecky

FOREIGN PATENT DOCUMENTS

CN 108899360 A 11/2018
CN 105633133 B 3/2019
DE 2456131 A1 6/1975
DE 2723951 A1 11/1978
JP S5721862 A 2/1982
(Continued)

OTHER PUBLICATIONS

Extended European Search Report for EP Application No. 23220797.7, dated Jun. 6, 2024, 9 pages.

*Primary Examiner* — Chad M Dicke
*Assistant Examiner* — Jeremy Daniel Watts
(74) *Attorney, Agent, or Firm* — KDW Firm PLLC

(57) ABSTRACT

A TRIAC semiconductor includes an N− region, multiple N+ regions, and a trench. The N− region is sandwiched between two P regions. The first P region is connected to an MT2 terminal and the second P region is connected to two MT1 terminals. The multiple N+ regions are located within the first P region. The trench is located between two gate terminals.

13 Claims, 6 Drawing Sheets

(56) References Cited

FOREIGN PATENT DOCUMENTS

| | | | |
|---|---|---|---|
| JP | S58134471 | A | 8/1983 |
| JP | 2723940 | B2 | 3/1998 |
| JP | 2024134471 | A | 10/2024 |
| TW | 201907566 | A | 2/2019 |
| WO | 2019158594 | A1 | 8/2019 |

* cited by examiner

TRIAC symbol

TRIAC physical structure

200

300

300

HIGH NOISE IMMUNITY TRIAC STRUCTURE

CROSS-REFERENCE TO CORRESPONDING APPLICATIONS

This application claims the benefit of priority to, Chinese Patent Application No. 2022117228306, filed Dec. 30, 2022, entitled "HIGH NOISE IMMUNITY TRIAC STRUCTURE," which application is incorporated herein by reference in its entirety.

FIELD OF THE DISCLOSURE

Embodiments of the present disclosure relate to triodes for alternating current (TRIACs) and, more particularly, to a TRIAC with high noise immunity.

BACKGROUND

Thyristors are semiconductor switches used to control the flow of electrical current. Thyristors are used in applications such as home appliances (lighting, heating, temperature control, alarm activation, fan speed), electrical tools (for controlling motor speed, stapling event, battery charging), and outdoor equipment (water sprinklers, gas engine ignition, electronic displays, area lighting, sports equipment, physical fitness).

Similar to diodes, thyristors are three-terminal devices with a PNPN configuration consisting of an anode terminal connected to a first P section, a cathode terminal connected to a second N section, and a gate terminal connected to the P section nearest the cathode. When a positive voltage is applied at the gate of the device, the thyristor turns on and will remain on, even if the gate signal is removed. If current flowing through the thyristor drops below a latch-on current level, the SCR will turn off. The thyristor conducts current only in one direction.

TRIACs (short for TRIode for Alternating Current) consist of two thyristors connected together in an inverse parallel relationship to one another. The two thyristors making up the TRIAC share a common gate terminal. Distinguishable from thyristors, TRIACs enable current to flow in both directions.

Because a very small amount of current in the gate will activate the device, both thyristors and TRIACs are sensitive to noise, as the noise may cause device mis-triggering and result in the application circuit malfunction.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a triode for alternating current (TRIAC) semiconductor in accordance with the present disclosure may include an N− region, multiple N+ regions, and a trench. The N− region is sandwiched between two P regions. The first P region is connected to an MT2 terminal and the second P region is connected to two MT1 terminals. The multiple N+ regions are located within the first P region. The trench is located between two gate terminals.

DETAILED DESCRIPTION

A triode for alternating current (TRIAC) semiconductor is disclosed. Following a sophisticated design in which a trench is added, the gate terminal and the MT1 terminal are each bisected into separate terminals. The trench cuts through portions of the N+ regions, through one P region, and also partly into the N− region. The effect of the trench is to divide the semiconductor into two halves, one of which operates when the bias of MT2 is higher than MT1 and the other of which operates when the bias of MT2 is lower than MT1. In addition to eliminating shunt current in the semiconductor and improving noise immunity, the novel trench-based design improves both static dv/dt and commutating performance.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components, each with respect to the geometry and orientation of other features and components appearing in the perspective, exploded perspective, and cross-sectional views provided herein. Said terminology is not intended to be limiting and includes the words specifically mentioned, derivatives therein, and words of similar import.

Figure 1B:
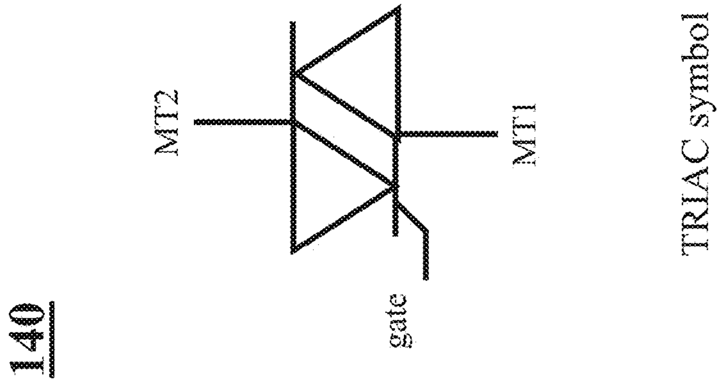
FIG. 1B (prior art)
FIGS. 1A-1D are diagrams illustrating a TRIAC, in accordance with the prior art.
Figure 1A:
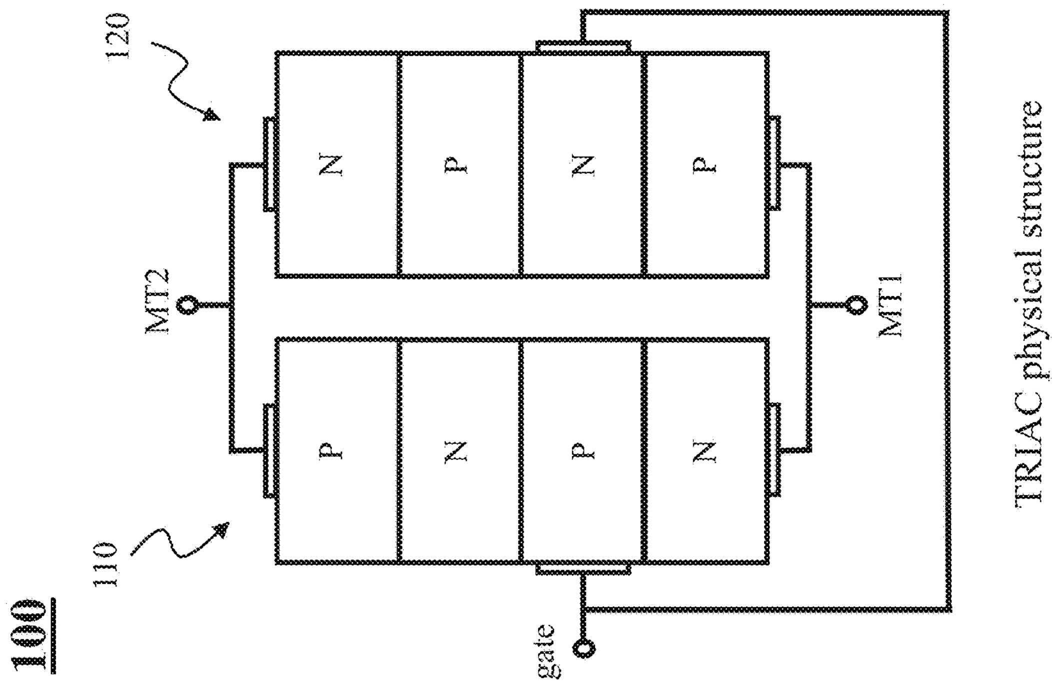
FIG. 1A (prior art)
Figure 1C:
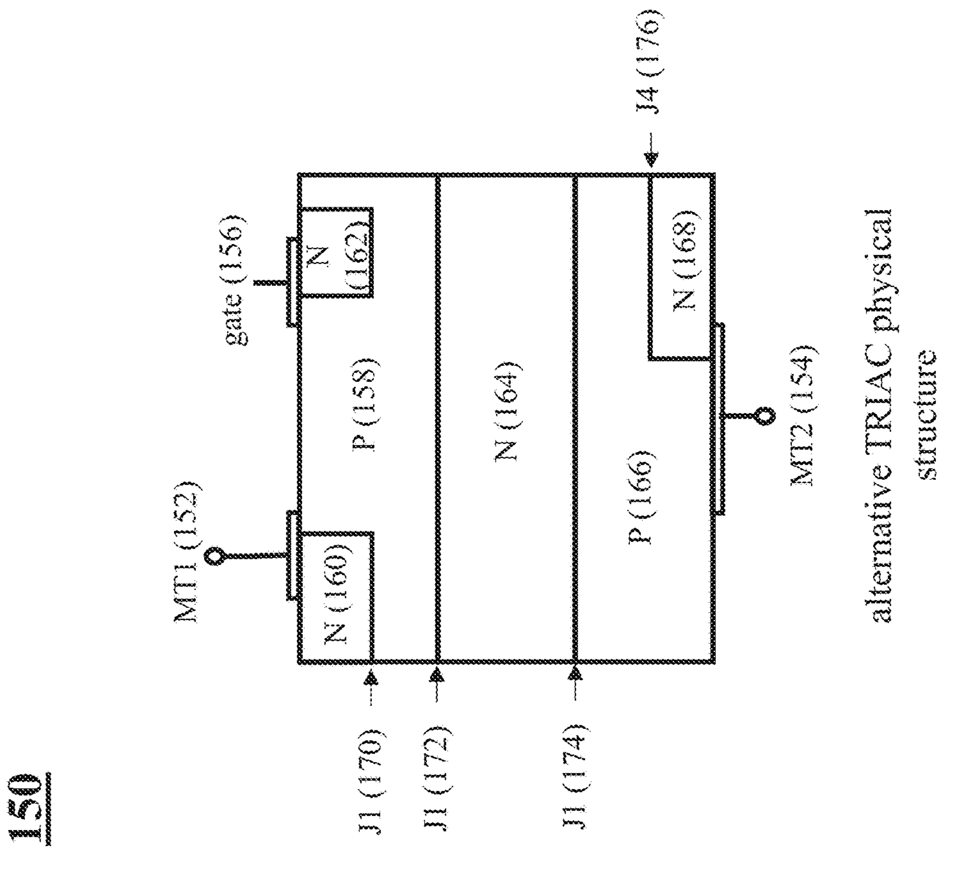
FIG. 1C (prior art)
Figure 1D:
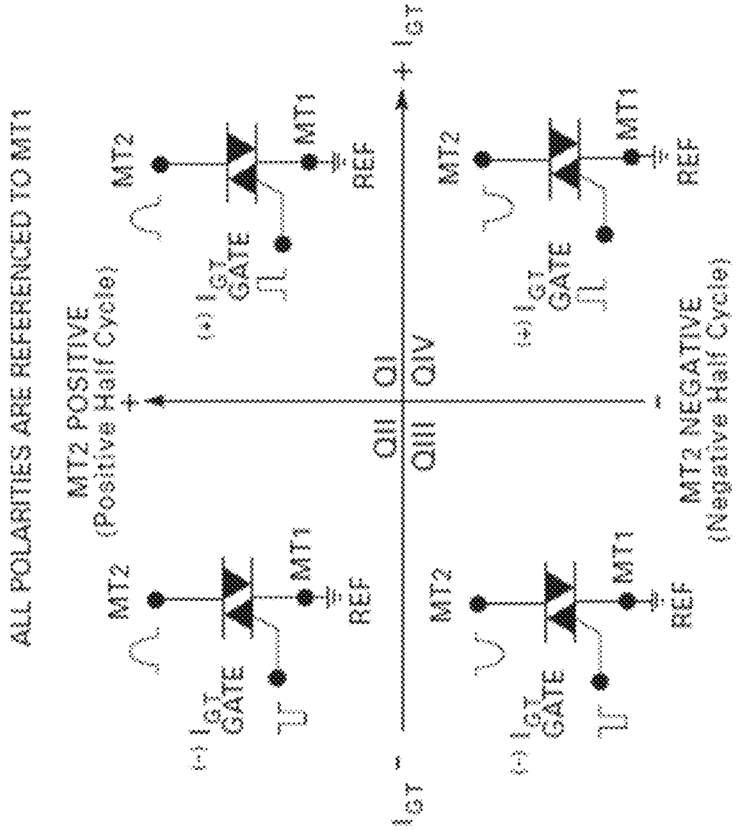
FIG. 1D (prior art)

FIGS. 1A-1D are representative drawings of a TRIAC, according to the prior art. FIG. 1A shows the TRIAC 100 (physical structure), FIG. 1B shows the TRIAC symbol 140, FIG. 1C shows a sophisticated TRIAC design, and FIG. 1D shows TRIAC behavior in four quadrants QI, QII, QIII, and QIV. The TRIAC 100 is a solid state semiconductor device having alternating layers of P-type material and N-type material, with the P-type material being silicon or germanium material doped with an electron acceptor element and the N-type material being silicon or germanium material doped with an electron donor element. The TRIAC 100 is essentially two back-to-back thyristors 110 and 120, the first thyristor 110 having a PNPN configuration and the second thyristor 120 having an NPNP configuration, as shown.

The TRIAC 100 is a three-terminal device having an MT1 terminal coupled to a bottom P layer and a bottom N layer, an MT2 terminal coupled to a top Player and a top N layer and a gate coupled to an inner Player and an inner N layer. The TRIAC 100 is a bidirectional device, allowing current to flow in both directions, in contrast to the thyristor, which is a unidirectional device. TRIACs are designed to control a relatively large amount of power and voltage with a small device.

FIG. 1C shows a second TRIAC 150, according to the prior art. The physical structure of the TRIAC 150 is more sophisticated than that of the TRIAC 100. As before, the TRIAC 150 has alternating N and P regions, as well as an MT1 terminal 152, an MT2 terminal 154, and a gate 156. P regions 158 and 166 and N regions 160, 162, 164, and 168 are shown, with N regions 160 and 162 being embedded within P region 158 and N region 168 being embedded within P region 166. N region 164 is sandwiched between P regions 158 and 166. The MT1 terminal 152 straddles the N region 160 and the P region 158, the MT2 terminal 154 straddles the P region 166 and the N region 168, and the gate straddles the P region 158 and the N region 162.

The TRIAC 150 features four junctions 170, 172, 174, and 176. Junction 170 is between the Player 158 and the N layer 160; junction 172 is between the N layer 164 and the P layer 158; junction 174 is between the N layer 164 and the Player 166, and junction 176 is between the Player 166 and the N layer 168. These junctions exhibit different behaviors based on quadrant in which the TRIAC is operating.

FIG. 1D shows TRIAC behavior in four quadrants, QI-QIV, according to the prior art. TRIACs thus have four operating modes, each mode corresponding to one of the quadrants. In the first mode (QI), MT2 is positive with respect to MT1 with a gate polarity positive with respect to MT1. In the second mode (QII), MT2 is positive with respect to MT1 with a gate polarity negative with respect to MT1. In the third mode (QIII), MT2 is negative with respect to MT1 with a gate polarity negative with respect to MT1. In the fourth mode (QIV), MT2 is negative with respect to MT1 with a gate polarity positive with respect to MT1.

Figure 2A:
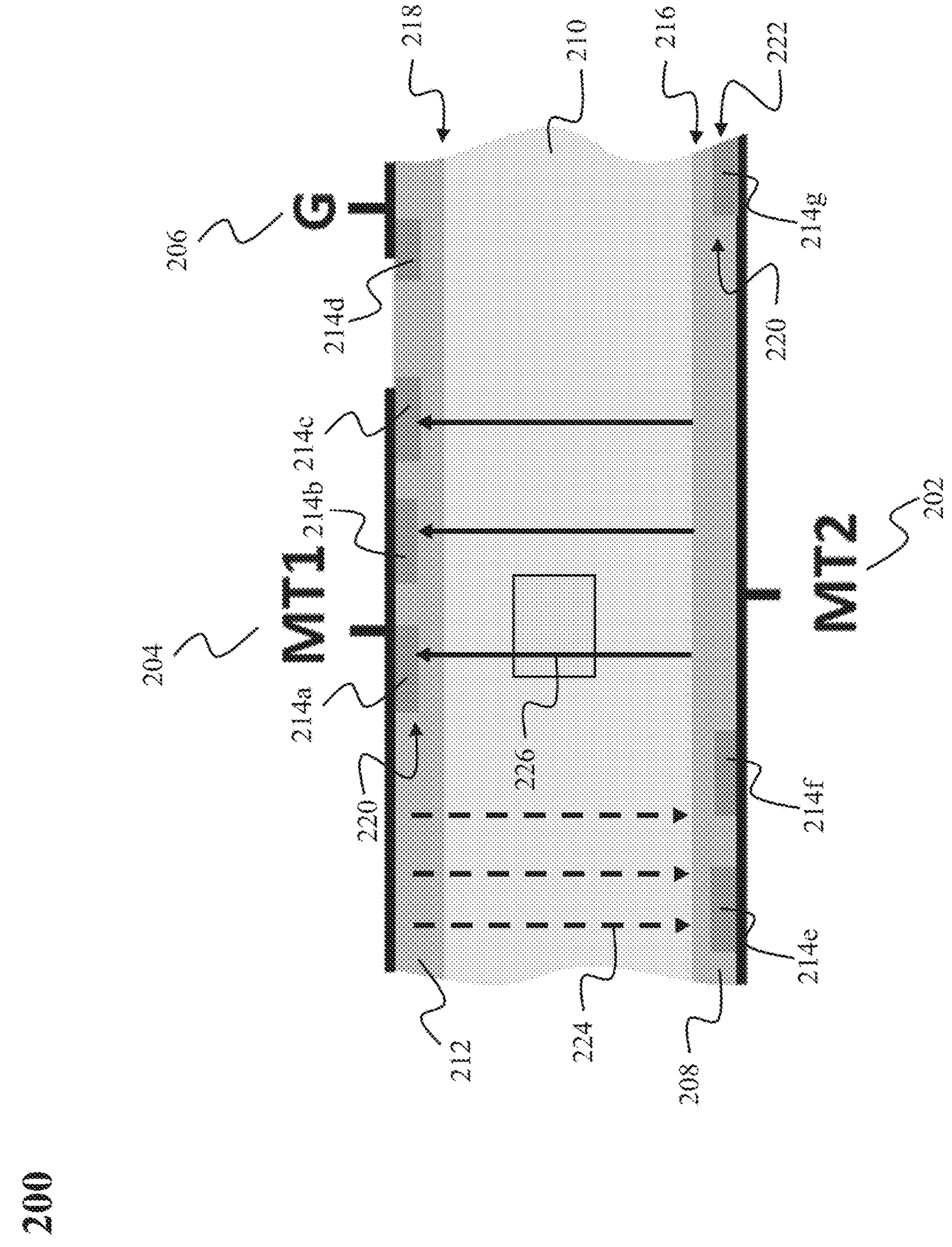
FIG. 2A (prior art)
FIG. 2 is a diagram illustrating a TRIAC, in accordance with the prior art.
Figure 2B:
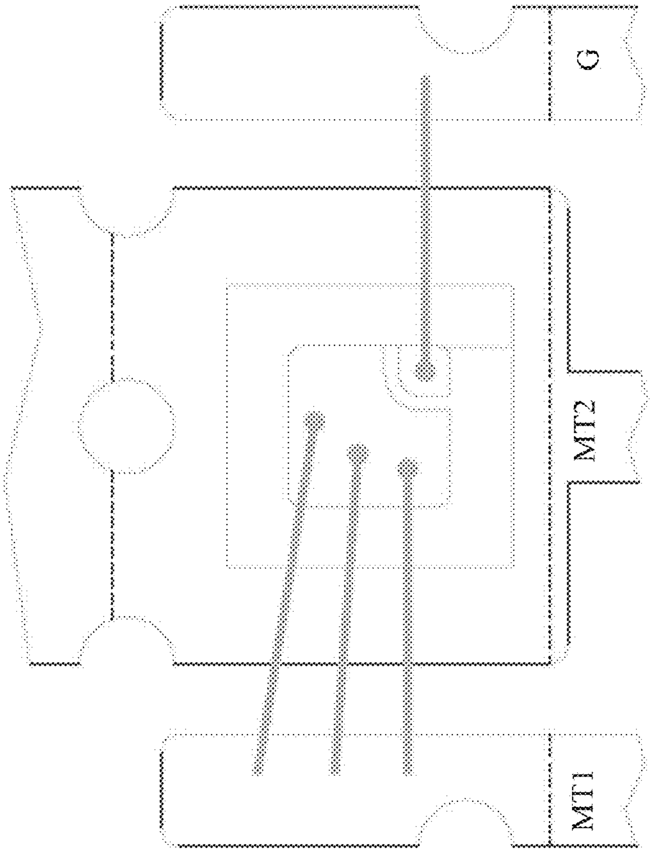
FIG. 2B (prior art)

FIGS. 2A-2B are representative drawings of a TRIAC semiconductor 200, according to the prior art. FIG. 2A is a side view and FIG. 2B is a top view from the package side of the TRIAC semiconductor 200. Though a little different from the TRIAC 150, the TRIAC semiconductor 200 is also a sophisticated design structure with a PNPN configuration. The TRIAC semiconductor 200 features an MT2 terminal 202 connected to a P region 208, which is adjacent an N− region 210, and an MT1 terminal 204 connected to a P region 212, which is also adjacent the N− region 210. The N− region 210 is sandwiched between the two P regions 208 and 212. A final N+ region of the TRIAC semiconductor 200 consists of multiple disjointed N+ regions 214*a*-214*g* (collectively, "N+ region(s) 214"), with N+ regions 214*a*, 214*b*, 214*c*, and 214*d* being in the P region 212 and N+ regions 214*e*, 214*f*, and 214*g* being in the P region 208. A gate terminal 206 is connected to the second P region 212.

Like the TRIAC 150, the TRIAC semiconductor 200 features four junctions 216, 218, and 220. Junction 216 is between the P region 208 and the N− region 210; junction 218 is between the N− region 210 and the P region 212; junction 220 is between the P region 212 and the N+ regions 214*a-d*, and junction 222 is between the P region 208 and the N+ regions 214*e-g*. As with the TRIAC 100, the junctions exhibit different behaviors based on the biases between the MT1 and MT2 terminals as well as the gate polarity (see FIG. 1D).

Dashed arrows 222 and solid arrows 224 denote electron/current paths. Dashed arrows 222 denote the current flow between MT1 terminal 204 and MT2 terminal 202. Solid arrows denote the current flow between MT2 terminal 202 and MT1 terminal 204. The TRIAC semiconductor 200 is triggered such that current flows between the MT2 terminal 202 and the MT1 terminal 204 by adding a positive bias on the gate terminal 206 or a negative bias on the gate terminal 206.

As with the TRIAC 100, the TRIAC semiconductor 200 is a switching device. Both the N+ region 214*d* and the P region 212 are located at the gate terminal 206. This allows the TRIAC semiconductor 200 to be turned on with either a negative or a positive voltage being applied. When a positive voltage is applied at the gate terminal 206, the gate cathode junction 220 will become forward biased, which allows the TRIAC semiconductor 200 to turn on. However, because of the disjointed N+ regions 214, current will flow between the disjointed N+ regions 214 and the P region 212 before the gate cathode junction 220 (N+P region) becomes forward biased. Electrons need to go through from the gate through this area because there is a resistance path without any PN junction area, which results in the occurrence of a shunt current before the gate cathode junction 220 can be forward biased.

With reference to the two-thyristor model (FIG. 1A) of the TRIAC 100, the N+ regions 214*a-d*, P region 212, the N region 210, and P region 208 of the TRIAC semiconductor 200 corresponds to the thyristor 120 and the P region 208, N region 210, P region 212, and N regions 214-*d* of the TRIAC semiconductor 200 corresponds to the thyristor 180. The connection of the two thyristors triggers the occurrence of regenerative action when a proper gate signal is applied to the base of the first NPN transistor.

The top view of the TRIAC semiconductor 200 package in FIG. 2B shows that the backside of the chip (left MT2) will be attached to the leadframe and connected with the center pin of the package (named MT2), MT1 of the chip will connect to the left pin of the package, and the gate of the chip will connect to the right pin of the package.

Figure 3A:
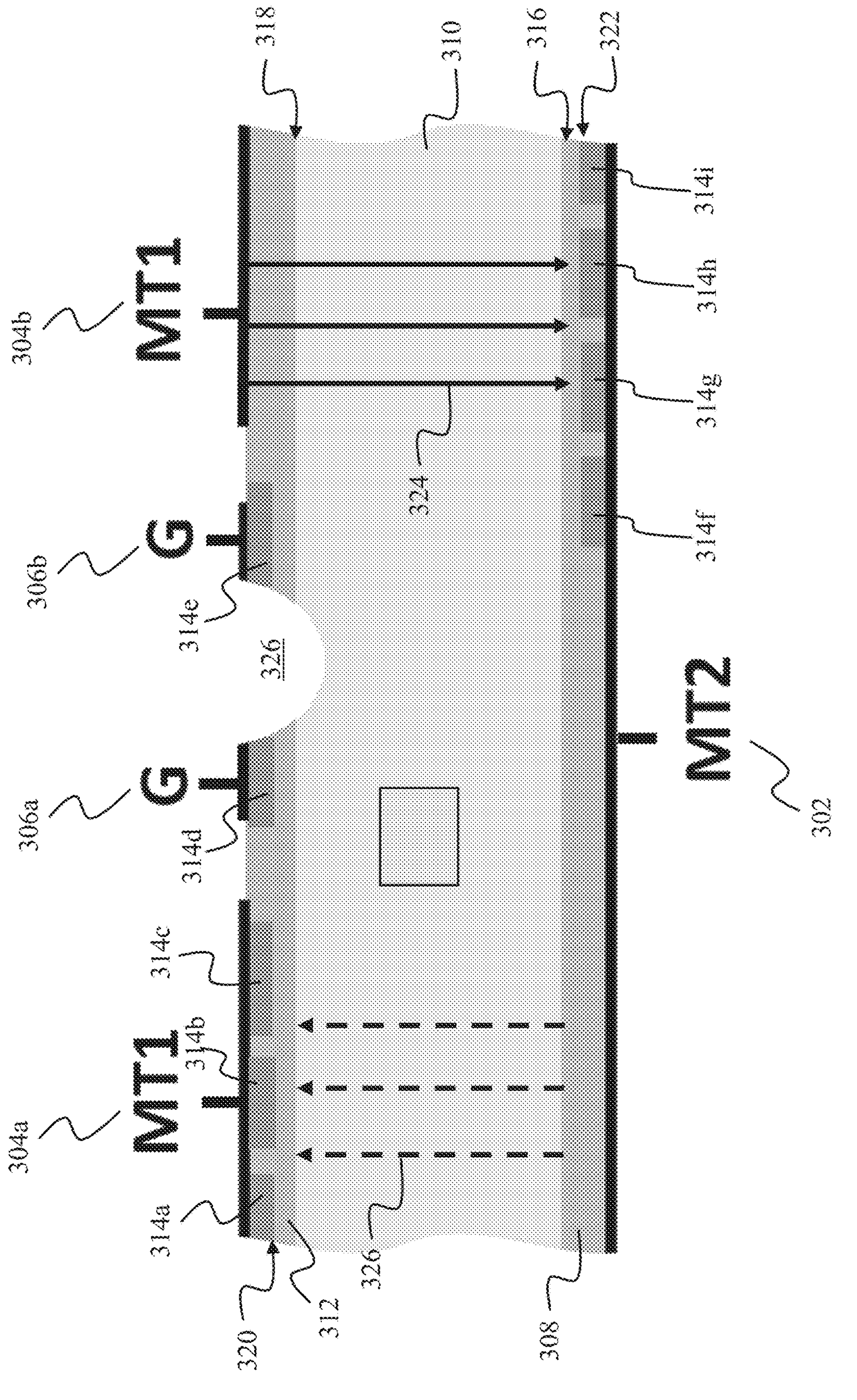
FIGS. 3A-3B are diagrams illustrating a TRIAC, in accordance with exemplary embodiments.
Figure 3B:
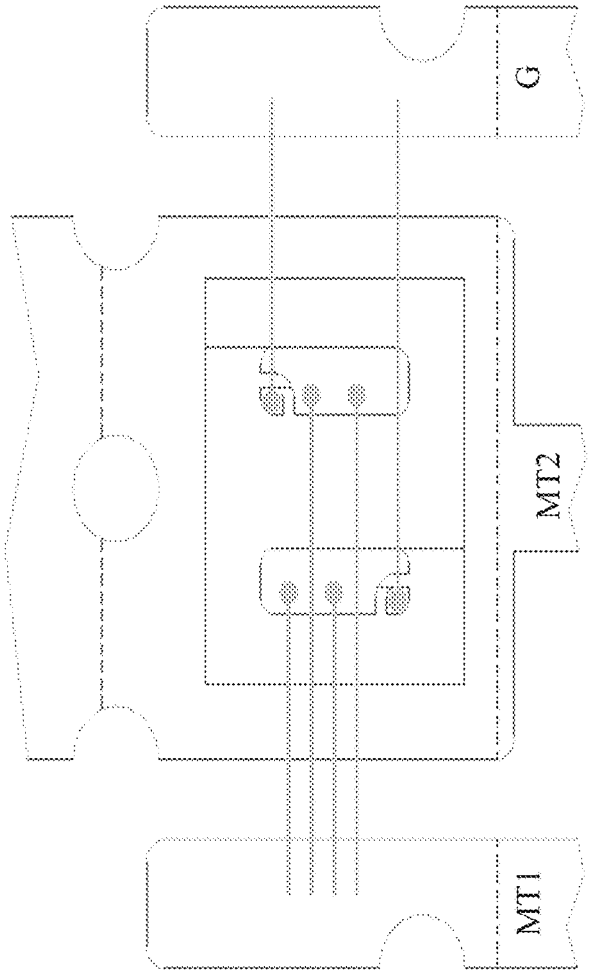

FIGS. 3A-3B are representative drawings of a TRIAC semiconductor 300, according to exemplary embodiments. FIG. 3A is a side view and FIG. 3B is a top view from the package side of the TRIAC semiconductor 300. In contrast to the prior art TRIAC semiconductor 200, a trench 326 isolates the TRIAC semiconductor 300 into two halves. The addition of the trench 326 makes the TRIAC semiconductor 300 operate like two transistors 180 and 190, as with the SCR 100 (FIG. 1B). The TRIAC semiconductor 300 features an MT2 terminal 302 connected to a P region 308, which is adjacent an N− region 310, and two MT1 terminals 304*a* and 304*b*, both of which are connected to a P region 312, which is also adjacent the N− region 310. The N− region 310 is sandwiched between the two P regions 308 and 312. A final N+ region of the TRIAC semiconductor 300 consists of multiple disjointed N+ regions 314*a*-214*i* (collectively, "N+ region(s) 314"), with N+ regions 314*a*, 314*b*, 314*c*, 314*d*, and 314*e* being in the P region 312 and N+ regions 314*f*, 314*g*, 314*h*, and 314*i* being in the P region 308. Dual gate terminals 306*a* and 306*b* are connected to the second P region 312 and disposed on either side of the trench 326.

In exemplary embodiments, the N+ region 314*d* is disposed beneath the gate 306*a* and the N+ region 314*e* is disposed beneath the gate 306*b*, with the trench 326 being between the two. In exemplary embodiments, the trench 326 passes through the P region 312 and cuts into the N-region 310. The trench 326 thus bisects three layers of the TRIAC 300, a portion of the N+ regions 314, the P region 312, and a portion of the N− region 310. In exemplary embodiments, the MT2 terminal 302 is connected to both the P region 308 and the N+ regions 314*f-i* while the MT1 terminal is connected to both the P region 312 and the N+ regions 314*a-c*.

In exemplary embodiments, the MT1 terminals 304*a* and 304*b* are connected together (by wires) in the package assembly. Similarly, in exemplary embodiments, the gate terminals 306*a* and 306*b* are connected together in the package assembly, as shown in FIG. 3B.

Like the other semiconductor devices described herein, the TRIAC semiconductor 300 features four junctions 316, 318, 320, and 322. Junction 316 is between the P region 308 and the N− region 310; junction 318 is between the N− region 310 and the P region 312; junction 320 is between the P region 312 and the N+ regions 314*a-e*; and junction 322 is between the N+ regions 314*f-i* and the P region 308.

As with the TRIAC 100, the junctions exhibit different behaviors based on the voltage bias between the M1 and M2 terminals as well as the gate polarity. Dashed arrows 322 and solid arrows 324 denote current paths. Dashed arrows 322 denote the current flow between the MT2 terminal 302 and the MT1 terminal 304*a*. Solid arrows denote the current flow between the MT1 terminal 304*b* and the MT2 terminal 302. If the MT2 terminal 302 is given a positive potential with respect to the MT1 terminal 304, then junctions 316 and 320 are forward-biased while junction 318 is reverse-biased. Accordingly, current will flow from the MT2 terminal 302 to the MT1 terminal 304*a*, as shown by the dashed arrows 322. If on the other hand, the MT2 terminal 302 is given a negative potential with respect to the MT1 terminal 304, then junctions 316 and 320 are reverse-biased while junction 318 is forward-biased. Accordingly, current will flow from the MT1 terminal 304*b* to the MT2 terminal 302, as shown by the solid arrows 324.

In exemplary embodiments, the left part of the silicon of the TRIAC semiconductor 300 works if the bias of the MT2 terminal 304 is higher than that of the MT1 terminal 304 and the right part of the silicon works if the bias of the MT1 terminal 304 is higher than that of the MT2 terminal 302. In exemplary embodiments, the TRIAC 300 semiconductor can make it easier to tune Igt, at different quadrants to give much better static dv/dt, which improves the noise immunity and commutating performance. In some embodiments, the TRIAC semiconductor 300 works in quadrants II and III, but not in quadrants I and IV.

The top view of the TRIAC semiconductor 300 package in FIG. 3B shows that, even though there are two MT1 terminals 304*a* and 304*b* and two gates 306*a* and 306*b*, when assembled, in a non-limiting example, the two MT1 terminals 304*a* and 304*b* will be connected to the left pin by five wires and the two gate terminals 306*a* and 306*b* will be connected to the right pin by two wires, although the number of wires for each connection may be adjusted based on the current requirement. The MT2 terminal 302 is attached to the leadframe pad and is drawn out from the center pin (MT2), which is the same as for the TRIAC 200 (FIG. 2B).

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure refers to certain embodiments, numerous modifications, alterations, and changes to the described embodiments are possible without departing from the sphere and scope of the present disclosure, as defined in the appended claim(s). Accordingly, it is intended that the present disclosure is not limited to the described embodiments, but that it has the full scope defined by the language of the following claims, and equivalents thereof.

The invention claimed is:

1. A triode for alternating current semiconductor comprising:
- a continuous N− region sandwiched between a first P region and a second P region, wherein the first P region is coupled to an MT2 terminal and the second P region is coupled to a first MT1 terminal and a second MT1 terminal;
- a first plurality of N+ regions disposed within the first P region;
- a second plurality of N+ regions disposed within the second P region; and
- a trench disposed adjacent to and directly between a first gate terminal and a second gate terminal to separate the first gate terminal and the second gate terminal, wherein a first N+ region of the second plurality of N+ regions is disposed beneath the first gate terminal and a second N+ region of the second plurality of N+ regions is disposed beneath the second gate terminal, wherein the trench is disposed adjacent to and directly between the first N+ region and the second N+ region to cut through the second plurality of N+ regions, wherein the trench is disposed directly adjacent to the second P region to cut through the second P region, and wherein the trench is disposed directly adjacent to the continuous N− region to cut into, but not through the continuous N− region.

2. The triode for alternating current semiconductor of claim 1, further comprising a first junction between the first P region and the continuous N− region.

3. The triode for alternating current semiconductor of claim 2, further comprising a second junction between the continuous N− region and the second P region.

4. The triode for alternating current semiconductor of claim 3, further comprising a third junction between the second P region and the second plurality of N+ regions.

5. The triode for alternating current semiconductor of claim 4, further comprising a fourth junction between the first plurality of N+ regions and the first P region.

6. The triode for alternating current semiconductor of claim 1, wherein there is no shunt current.

7. The triode for alternating current semiconductor of claim 1, wherein a third N+ region of the second plurality of N+ regions is disposed beneath the first MT1 terminal.

8. The triode for alternating current semiconductor of claim 7, wherein a fourth N+ region of the second plurality of N+ regions is disposed beneath the first MT1 terminal.

9. The triode for alternating current semiconductor of claim 8, wherein a third fifth N+ region of the second plurality of N+ regions is disposed beneath the first MT1 terminal.

10. The triode for alternating current semiconductor of claim 1, wherein a first N+ region of the first plurality of N+ regions is disposed beneath the MT2 terminal.

11. The triode for alternating current semiconductor of claim 10, wherein a second N+ region of the first plurality of N+ regions is disposed beneath the MT2 terminal.

12. The triode for alternating current semiconductor of claim 11, wherein a third N+ region of the first plurality of N+ regions is disposed beneath the MT2 terminal.

13. The triode for alternating current semiconductor of claim 12, wherein a fourth N+ region of the first plurality of N+ regions is disposed beneath the MT2 terminal.

* * * * *